United States Patent
Famili et al.

(10) Patent No.: US 9,590,318 B2
(45) Date of Patent: Mar. 7, 2017

(54) MODULAR DESIGN OF A HIGH POWER, LOW PASSIVE INTERMODULATION, ACTIVE UNIVERSAL DISTRIBUTED ANTENNA SYSTEM INTERFACE TRAY

(71) Applicant: Intel Corporation, Santa Clara, CA (US)

(72) Inventors: Nader Famili, Los Angeles, CA (US); Purna C. Subedi, Irvine, CA (US); Yatin Buch, Tustin, CA (US); Jason Cook, Huntington Beach, CA (US); Changru Zhu, Santa Ana, CA (US); George Sideris, Irvine, CA (US); Robert Balue, Santa Ana, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/779,635

(22) PCT Filed: Jul. 24, 2014

(86) PCT No.: PCT/IB2014/001957
§ 371 (c)(1),
(2) Date: Sep. 24, 2015

(87) PCT Pub. No.: WO2015/011562
PCT Pub. Date: Jan. 29, 2015

(65) Prior Publication Data
US 2016/0056540 A1 Feb. 25, 2016

Related U.S. Application Data

(60) Provisional application No. 61/858,547, filed on Jul. 25, 2013.

(51) Int. Cl.
*H05K 5/00* (2006.01)
*H01Q 21/00* (2006.01)
(Continued)

(52) U.S. Cl.
CPC ....... *H01Q 21/0025* (2013.01); *H01P 1/2138* (2013.01); *H05K 5/0021* (2013.01); *H05K 7/14* (2013.01); *H04B 1/525* (2013.01)

(58) Field of Classification Search
CPC .... H01Q 21/0025; H01P 1/2138; H05K 7/14; H05K 5/0021; H04B 1/525
See application file for complete search history.

(56) References Cited

U.S. PATENT DOCUMENTS

| | | | |
|---|---|---|---|
| 2009/0087152 A1* | 4/2009 | Wich | G02B 6/4471 385/102 |
| 2009/0310972 A1* | 12/2009 | Wayman | H04B 10/25758 398/115 |

(Continued)

FOREIGN PATENT DOCUMENTS

WO    WO-2015011562 A1    1/2015

OTHER PUBLICATIONS

"International Application Serial No. PCT/IB2014/001957, International Search Report mailed Nov. 14, 2014", 6 pgs.

(Continued)

*Primary Examiner* — Chuong A Ngo
(74) *Attorney, Agent, or Firm* — Schwegman Lundberg & Woessner, P.A.

(57) ABSTRACT

A modular high power, low passive intermodulation, active, universal, distributed antenna system interface tray that includes one or more front-end RF frequency duplexers instead of a high power, low passive intermodulation attenuator to achieve superior FIM performance. A cable switch matrix allows for the use of the system among varying power levels* and accomplishes the above in a modular architecture.

11 Claims, 4 Drawing Sheets

(51) Int. Cl.
    *H01P 1/213*     (2006.01)
    *H05K 7/14*     (2006.01)
    *H04B 1/525*     (2015.01)

(56) References Cited

U.S. PATENT DOCUMENTS

| | | |
|---|---|---|
| 2009/0311969 A1 | 12/2009 | Wayman et al. |
| 2010/0296816 A1 | 11/2010 | Larsen |
| 2011/0008042 A1 | 1/2011 | Stewart |
| 2011/0188220 A1* | 8/2011 | Blackwell, Jr. .......... H05K 1/11 361/802 |

OTHER PUBLICATIONS

"International Application Serial No. PCT/IB2014/001957, Written Opinion mailed Nov. 14, 2014", 9 pgs.

"International Application Serial No. PCT/IB2014/001957, International Preliminary Report on Patentability mailed Feb. 4, 2016", 11 pgs.

* cited by examiner

MODULAR DESIGN OF A HIGH POWER, LOW PASSIVE INTERMODULATION, ACTIVE UNIVERSAL DISTRIBUTED ANTENNA SYSTEM INTERFACE TRAY

This application is a U.S. National Stage Filing under 35 U.S.C. 371 from International Application No. PCT/IB2014/001957, filed Jul. 24, 2014 and published in English as WO 2015/011562 on Jan. 29, 2015, which claims the benefit of priority under 35 U.S.C. 119(e) to U.S. Provisional Patent Application Ser. No. 61/858,547, filed Jul. 25, 2013, each of which is incorporated herein by reference in its entirety.

BACKGROUND OF THE INVENTION

1. Field of the Invention

The present invention relates to distributed antenna systems in telecommunications networks.

2. Description of the Prior Art

The modular design of a high power, low Passive Inter-Modulation (PIM), base station management interface for Distributed Antenna System (DAS) applications in telecommunications networks is designed for use in the telecommunication industry. A typical deployment of a Base Telecommunication Station (BTS) in the telecommunication industry is designed for high Radio Frequency (RF) power input signals. The high RF power signal provides the necessary RF power to provide both coverage and capacity in a telecommunications network and is often associated with a macro-network solution that supports high RF power antennas. In a DAS deployment, however, the goal of the network solution is to add coverage and capacity to an area where the antenna RF signal is weak or cannot be accessed, for example inside a tunnel, a stadium or an airport; that is, either in a building or outdoor. Also, DAS deployments are typically used in areas where the antennas are in close proximity to the public (UE). As a result, the RF power of the antenna must be kept low to meet minimum radiated emissions standards determined by the Federal Communications Commission (FCC). Therefore, DAS deployments utilize a low RF power signal that is used in conjunction with low RF power antennas. The RF signal is also required to have very low levels of PIM. PIM levels that are too high can cause interference in the low RF power signals in the antenna receive (Rx) path, resulting in a multitude of issues inside telecommunication networks. To this end it becomes necessary to have an interface between the BTS and the DAS that can adjust the signal input RF power level from the BTS to signal output RF power levels that are harmonious with the requirements of a DAS while inducing very low PIM levels into the attenuated RF signal.

SUMMARY OF THE INVENTION

The present invention satisfies the requirement of providing an interface between the BTS and the DAS that can adjust the signal input RF power level from the BTS to signal output RF power levels that are harmonious with the requirements of a DAS while inducing very low PIM levels into the attenuated RF signal. This is done in a modular format that can be applied over varying signal RF frequency inputs and signal RF power levels with very low PIM. The invention provides active DAS tray monitors and regulates user defined BTS input power to the desired threshold level. This invention saves significant space compared to "passive" DAS trays.

The present invention is a modular design of a high power, low PIM-BTS management interface for DAS applications in telecommunications networks. The invention includes RF duplexed modules that attenuate high RF power input signal (up to 100 W) typical of a BTS to a lower RF power output signal with very low PIM suitable for use in a DAS. The modular design allows for up to 12 separate BTS RF input signals, at different RF frequencies and signal RF power levels, to be attenuated to meet the lower RF power output signal levels required for DAS networks in a single, industry standard, 19" rack, 4 U enclosure, for example.

The modular design of a high power, low PIM, active, universal DAS interface tray demonstrates several unique features and benefits including, but not limited to, the functionality to attenuate both high and low power RF input signals from a BTS, via a cable switch matrix located on the RF module, to low and high RF power DAS output signals with low PIM. The low PIM requirement is realized through a front-end RF frequency signal duplexer, instead of a high power (up to 100 W), low PIM attenuator. The modular design supports up to twelve different RF modules with various RF frequencies and RF power levels that are configured via the cable switch matrix in a single standard 19" tack, 4 U enclosure. All the modules are completely independent and can be field configurable to meet the demands of particular BTS and DAS network requirements.

DETAILED DESCRIPTION OF THE INVENTION

The present invention is a modular configuration of a high power, low passive intermodulation, active, universal distributed antenna system interface tray. It will be referred to herein as "the device." The device functions by attenuating the input power signal of a BTS to a lower power RF output signal level that can be utilized in a DAS network solution. The device can function with a variety of input BTS signal power levels, adjustable via a cable switch matrix, and frequencies. The device can also provide noise and gain adjustment of the uplink path of the RF signal. The device generates an attenuated RF output signal power level that is specified by the user via a software graphical user interface (GUI) from the BTS input signal frequency band with very low PIM characteristics. The functionality of the device can be repeated in a plurality of RF modules that can be of various frequencies and power levels within the main chassis. The example of 12 RF modules will be described herein but the invention is not limited to the use of that specific number of modules. The frequency is adjusted by the front end duplexer of the module, and the power level can be adjusted via a cable switch matrix at the front of the module.

The device can support all wireless frequency bands, all power levels from BTS (from 100 mW to 100 W), all DAS power levels (0 dBm to +36 dBm), and all wireless protocols (e.g. GSM, CDMA, LTE, W-CDMA, etc.). The device includes three main parts: the RF module, the main chassis and the Supervisor Control/PSU module.

Figure 1:
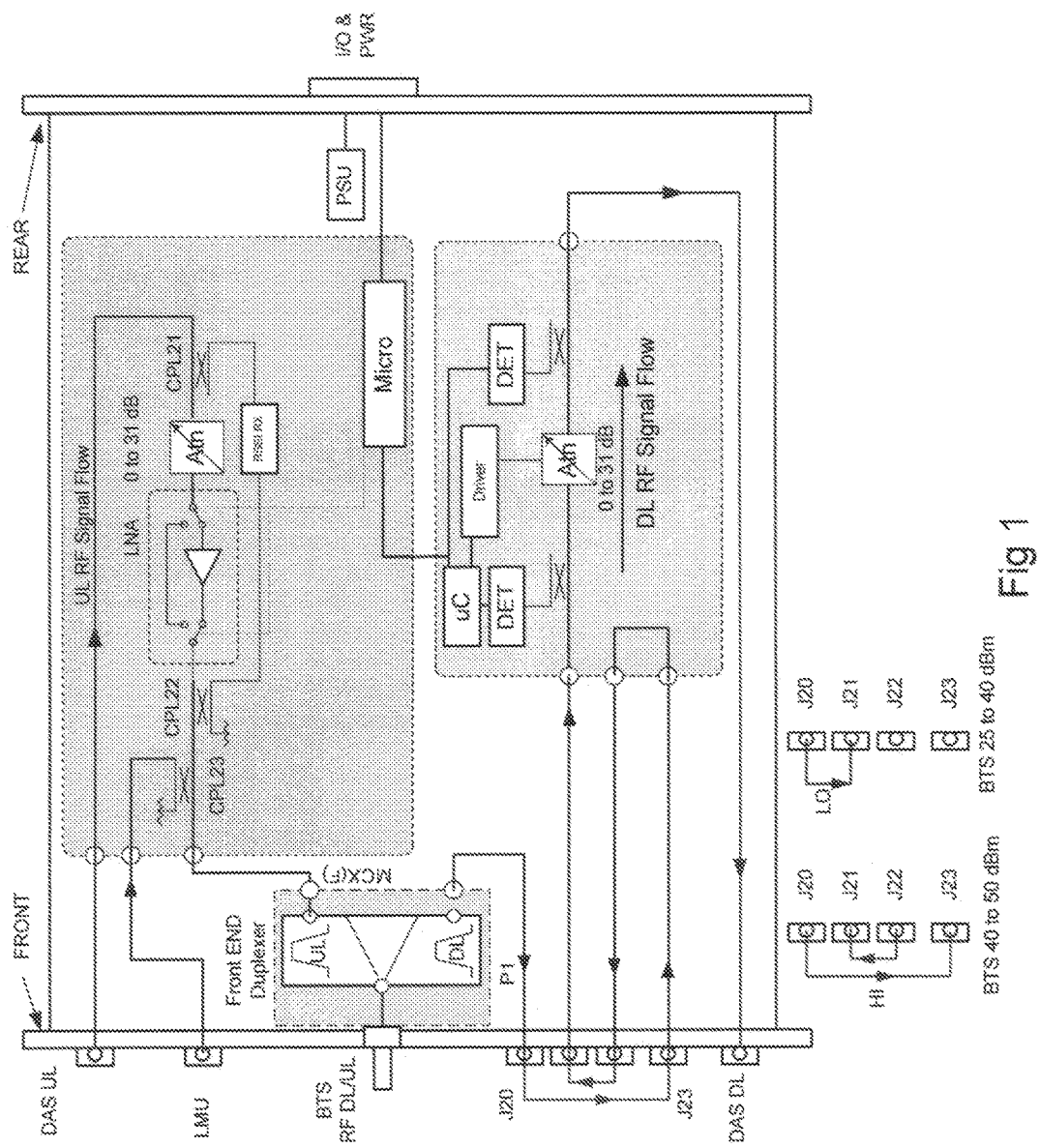
FIG. 1 is a schematic block diagram for a single duplex RF module of the present invention.

Referring now to FIG. 1, an embodiment of the RF module portion of the device is shown in a block diagram. The RF module itself includes three main parts with distinct functionality, a front-end duplexer, a downlink section and an uplink section.

Figure 3:
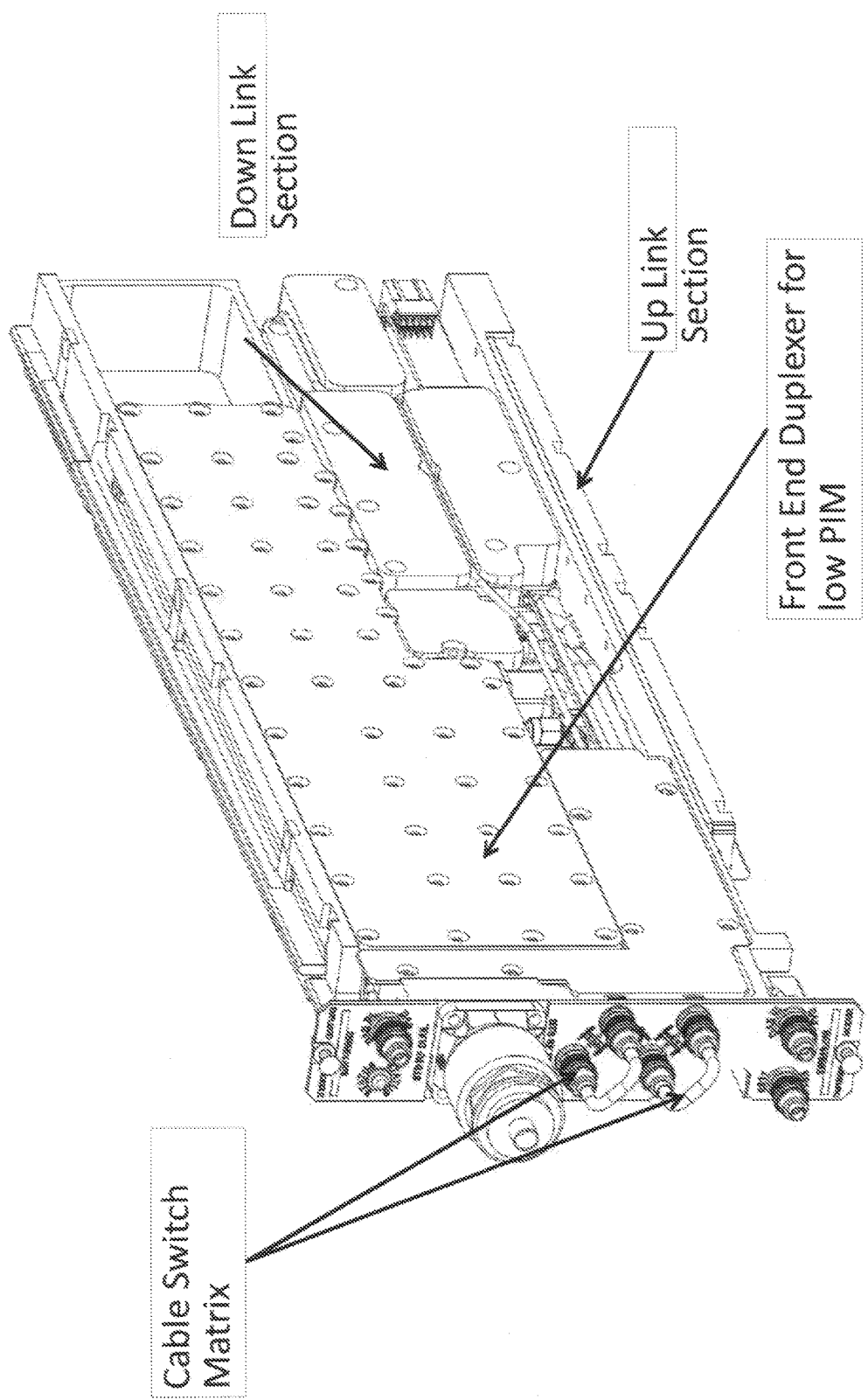
FIG. 3 is an isometric view of the RF module with cable switch matrix for configuring the unit for high or low BTS input power, and front-end duplexer to maintain a PIM RF power signal.

Referring now to FIG. 3, the first part of the RF module is the front-end duplexer module. The front-end duplexer of that module allows for transmit and receive RF signals to share a common antenna port. Therefore, the front-end duplexer acts as the first element that the transmit signal from the BTS encounters and the last element the receive signal encounters before returning to the BTS. The front-end duplexer provides the function of providing the low PIM interface for transmit signal entering the device. The low PIM interface is important due to the fact that in a duplexed system, transmit and receive signals share a common antenna interface. Transmit signals have a much higher RF power level than the receive signals especially in the application that the device is intended to support in a network architecture. Passive intermodulation in the transmit path can cause interference and signal noise in the receive signal that will prevent the network from functioning properly, thus for the device, the front-end duplexer provides an important role in the functionality of the device in a DAS network. The duplexer is realized in the device via a cavity filter configured to enable low PIM functionality at the high power levels required by the DAS network.

The second part of the RF module is the downlink (DL) functionality section. The DL section of the device provides the stepped attenuation of the transmit signal that transforms high power BTS signal input in a low power transmit signal that can be used by the DAS network. Prior to the transmit signal reaching the input port of the DL section, the signal is processed through a cable switch matrix. Referring to FIG. 3, the cable switch matrix is a manual set of cable jumpers that are configured on the front panel of the RF module. The cable jumpers are set based on the known input RF power generated by the BTS. For high power signals, the cable jumpers are set to route the transmit signal from the front-end duplexer to a 10 dB power coupler. The functionality of the coupler is to terminate a portion of the RF power into a 50-ohm termination resistor. The termination resistor absorbs the excess RF power from the transmit signal and allows the signal to then be routed to a DL portion containing a series of stepped attenuators that further reduce the RF power level of the signal. The stepped attenuator can be used or bypassed, depending on the input RF power level and the desired output RF power level. The output power level is controlled via a software GUI and can be configured by the user for the DAS network. Each of the individual RF modules in the device can be individually configured and controlled. The cable switch matrix can also be used to bypass the coupler and the termination resistor. This functionality allows for lower power RF input signals from the BTS to be supported in the DAS network. The bypassing of the coupler and the termination resistor allow for transmit signal power from the front-end duplexer to be in the same range prior to the input of the step attenuator function of the DL section. The cable switch matrix provides a user-friendly interface for configuring the individual RF modules based on the input power from the BTS.

The third part of the RF module, referenced in FIG. 3, is the uplink (UL) functionality. The UL section receives the uplink signal from the DAS network back to the BTS via the front-end duplexer and the common antenna port. The UL provides a noise detection function of the uplink signal received from the DAS network and, via a low noise amplifier section, the UL can add gain to the receive signal prior to transmission to the BTS. The fixed gain of the system can be set based on the desired performance of the network. The noise detection is an important parameter in the overall performance of the network as it is used to provide an alarm to the network that the noise level in the system is above the desired threshold, which noise level may result in adverse performance of the network. The UL gain and noise detection functionality are effective functions of the device as used in the network architecture. The UL also provides UL power measurement within the frequency band of operation, which can be very useful for plotting spectrum on the GUI.

Figure 2:
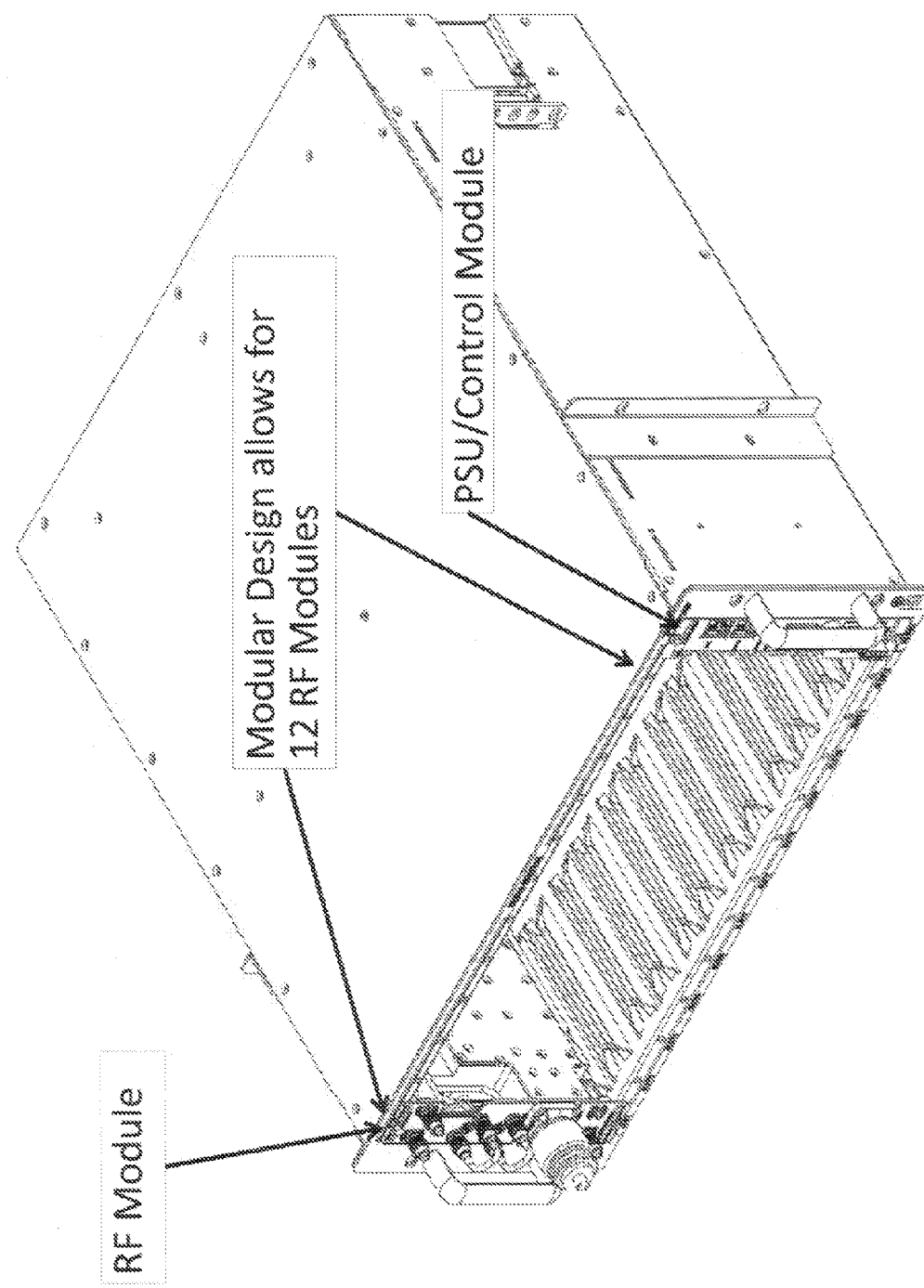
FIG. 2 is an isometric view of a partially populated 19" rack, 4 U main chassis capable of supporting up to twelve RF modules, a main chassis and a supervisor Control/Power Supply Unit (PSU) module of the invention.

The RF module functions are all powered and controlled by the Supervisor Control/PSU module, which is shown in FIG. 2. The Supervisor Control/PSU module provides all the control functions for the required attenuation of the DL path, UL noise detection and UL gain. It also supplies all the power required for the individual modules as well as the power and speed of fans in the main chassis. All functions in the Supervisor/PSU module are controlled via software that can be adjusted through a software GUI by the end user. The software uses a local area network (LAN) connection as the interface into the Supervisor Control/PSU module. The signals from the Supervisor Control/PSU module are transmitted out to the individual modules and information is received back via a backplane printed circuit board assembly (PCBA) mounted in the main chassis. Signals are switched and routed via the backplane such that each module can be controlled and configured independently of the other modules providing maximum flexibility and variety.

Figure 4:
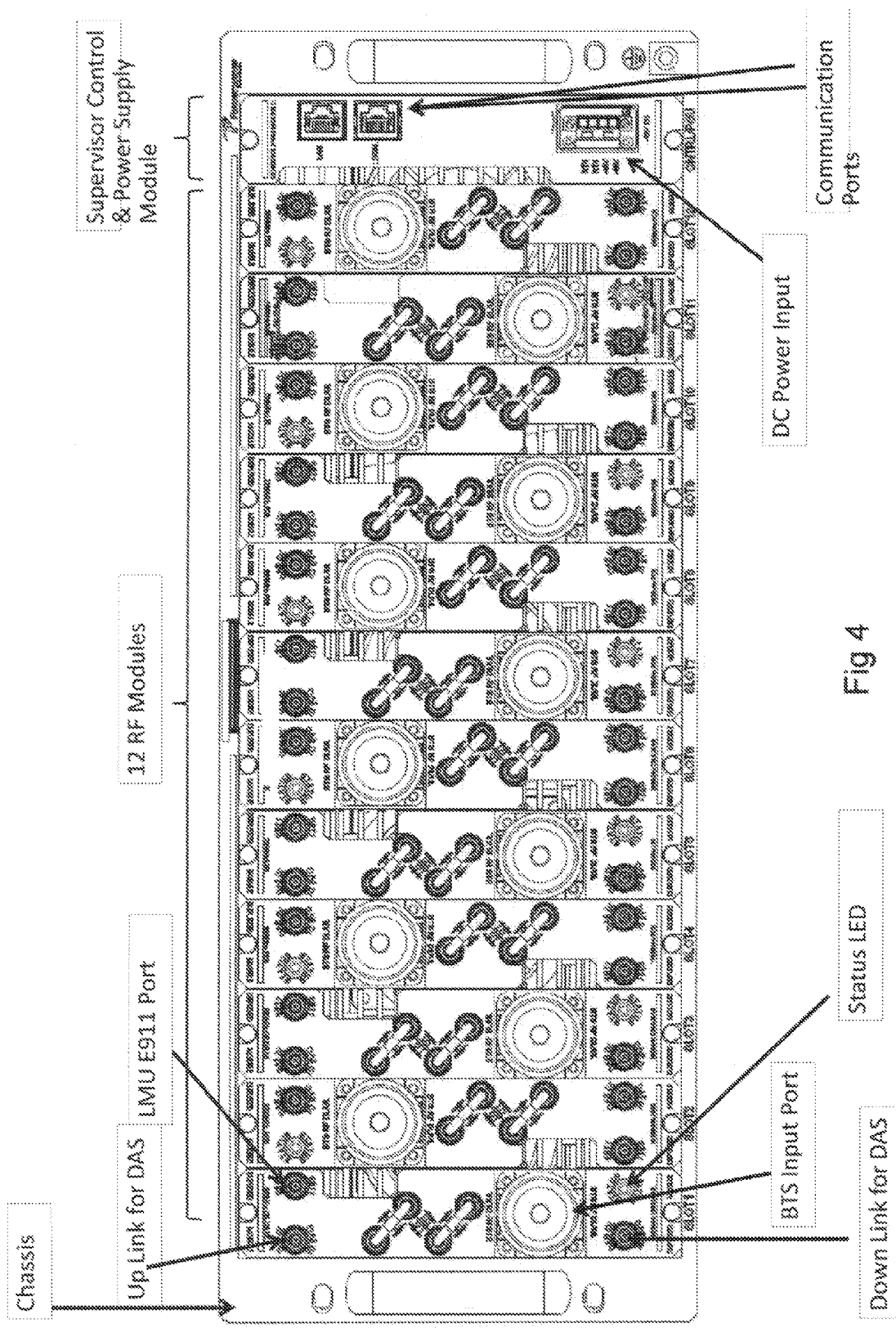
FIG. 4 is a front view of fully populated main chassis showing the twelve RF modules and the Supervisor Control/PSU module installed.

An embodiment of the main chassis is shown in FIG. 4. The main chassis is the final primary unit of the device. The main chassis includes mechanical structure to support the RF modules and the Supervisor Control/PSU module. The main chassis contains the backplane PCBA as well as the fans used to actively cool the system. The main chassis is designed in such a way that the spacing of input common antenna connector ports do not interfere with each other as the mating connector cable assembly is installed. FIG. 2 shows the functionality of this feature. It allows for the BTS input cable to be installed/uninstalled without having to remove or disconnect the surrounding modules. The main chassis also utilizes a staggered rail input system to prevent the modules from being installed in the wrong/incorrect orientation, and allows for ease of installation by hand. This provides the user with a distinctly unique installation system that prevents the improper installation of the modules in a user friendly manner. The main chassis is also frequency band/power level/air interface agnostic. Any of the module slots in the main chassis can be used by any frequency band/power level/air interface without affecting the performance of the system or the DAS network. All of the main chassis functionality may be established in a 4 U (7" tall), 19" rack system. The ability to support multiple independent modules in the size of main chassis is an advantage of the device.

The present invention has been described with reference to a specific embodiment but is not intended to be so limited. The scope of the invention is defined by the appended claims.

What is claimed is:

1. A modular high power, low passive intermodulation (PIM), active, universal distributed antenna system (DAS) interface tray for providing an interface between a base telecommunication station (BTS) and the DAS that can attenuate the signal input radio frequency (RF) power level from the BTS to signal output RF power levels that are harmonious with the requirements of a DAS network while inducing very low PIM levels into the attenuated RF signal, the interface tray comprising:
   a main chassis;
   a plurality of RF modules coupled to the main chassis; and
   a Supervisor Control Power Supply Unit (PSU) module coupled to the main chassis, wherein the RF modules comprise a downlink section comprising a cable switch matrix comprising a set of cable jumpers and a series of stepped attenuators, the set of cable jumpers configurable on a front panel to attenuate the downlink transmit signals received from the BTS based on input RF power levels of the downlink transmit signals received from the BTS to reduce PIM levels.

2. The interface tray of claim 1 wherein each of the RF modules further includes a front-end duplexer, and an uplink section.

3. The interface tray of claim 2 wherein, the front-end duplexer is a cavity filter configured to enable low PIM functionality at high power levels required by the DAS network.

4. The interface tray of claim 2 wherein the Supervisor Control/PSU module is configured to provide control functions for the required attenuation of a downlink path, an uplink noise detection and uplink gain.

5. The interface tray of claim 2 wherein each RF module is configured for different frequencies,
   wherein a front-end duplexer of each RF module is to provide a common antenna port for downlink transmit signals received from a BTS and uplink receive signals transmitted to the BTS, the front-end duplexer to provide downlink transmit signals received from a BTS to the downlink section;
   wherein the downlink section is configured to control an output power level of downlink transmit signals provided via the DAS via a software GUI,
   wherein the uplink section to configured receive uplink signals via/from the DAS, provide gain and perform a noise detection function on the received uplink signals, and provide the received uplink signals to the front-end duplexer for transmission to the BTS;
   wherein the cable switch matrix allows the attenuation of the downlink transmit signals received from the BTS of each RF module to be individually set, and
   wherein the front-end duplexer of each RF module is configured to terminate a portion of the downlink transmit signals received from the BTS in a termination resistor and route the signals to the series of stepped attenuators configured with the cable jumpers.

6. The interlace tray of claim 1 wherein the main chassis is designed in such a way that the spacing of input common antenna connector ports do not interfere with each other as a mating connector cable assembly is installed.

7. The interface tray of claim 6 wherein the main chassis includes s staggered rail input system to prevent the one or more RF modules from being installed therein in an incorrect orientation.

8. The interface tray of claim 6 wherein the main chassis is frequency band/power level/air interface agnostic.

9. A modular interface for a distributed antenna system (DAS), the interface module comprising:
   a plurality of radio frequency (RF) modules, each RF module configured for different frequencies, each RF module comprising:
      a front-end duplexer to provide a common antenna port for downlink transmit signals received from a base telecommunication station (BTS) and uplink receive signals transmitted to the BTS, the front-end duplexer to provide downlink transmit signals received from a BTS to a downlink section;
      a downlink section coupled to the front-end duplexer, the downlink section comprising a cable switch matrix comprising a set of cable jumpers and a series of stepped attenuators, the set of cable jumpers configurable on a front panel of the associated RF module to attenuate the downlink transmit signals received from the BTS based on input RF power levels of the downlink transmit signals received from the BTS to reduce passive intermodulation (PIM) levels, the downlink section configured to control an output power level of downlink transmit signals provided via the DAS via a software GUI; and
      an uplink section to receive uplink signals via/from the DAS, provide gain and perform a noise detection function on the received uplink signals, and provide the received uplink signals to the front-end duplexer for transmission to the BTS.

10. The modular interface of claim 9 wherein the cable switch matrix allows the attenuation of the downlink transmit signals received from the BTS of each RF module to be individually set.

11. The modular interface of claim 10 wherein the duplexer is configured to terminate a portion of the downlink transmit signals received from the BTS in a termination resistor and route the signals to the series of stepped attenuators configured with the cable jumpers.

* * * * *

UNITED STATES PATENT AND TRADEMARK OFFICE
CERTIFICATE OF CORRECTION

PATENT NO.         : 9,590,318 B2
APPLICATION NO.    : 14/779635
DATED              : March 7, 2017
INVENTOR(S)        : Famili et al.

It is certified that error appears in the above-identified patent and that said Letters Patent is hereby corrected as shown below:

In the Claims

In Column 6, Line 2, in Claim 7, after "includes" delete "s"

Signed and Sealed this
Twenty-first Day of April, 2020

Andrei Iancu
*Director of the United States Patent and Trademark Office*